(12) United States Patent
Koh

(10) Patent No.: US 7,663,214 B2
(45) Date of Patent: Feb. 16, 2010

(54) HIGH-CAPACITY MEMORY CARD AND METHOD OF MAKING THE SAME

(75) Inventor: Wei Koh, Irvine, CA (US)

(73) Assignee: Kingston Technology Corporation, Fountain Valley, CA (US)

(*) Notice: Subject to any disclaimer, the term of this patent is extended or adjusted under 35 U.S.C. 154(b) by 58 days.

(21) Appl. No.: 11/188,948

(22) Filed: Jul. 25, 2005

(65) Prior Publication Data

US 2007/0018297 A1 Jan. 25, 2007

(51) Int. Cl.
*H01L 23/02* (2006.01)
(52) U.S. Cl. ............................. 257/679; 257/E23.064
(58) Field of Classification Search ................. 257/679, 257/99, E23.064
See application file for complete search history.

(56) References Cited

U.S. PATENT DOCUMENTS

| | | | |
|---|---|---|---|
| 5,173,840 A | 12/1992 | Kodai et al. | |
| 5,244,840 A | 9/1993 | Kodai et al. | |
| 5,422,514 A | 6/1995 | Griswold et al. | |
| 5,612,513 A | 3/1997 | Tuttle et al. | |
| 5,677,568 A | 10/1997 | Ochi et al. | |
| 5,700,981 A | 12/1997 | Tuttle et al. | |
| 5,776,798 A | 7/1998 | Quan et al. | |
| 5,796,164 A | 8/1998 | McGraw et al. | |
| 5,907,477 A | 5/1999 | Tuttle et al. | |
| 6,066,804 A | 5/2000 | Hamada et al. | |
| 6,072,122 A | 6/2000 | Hosoya | |
| 6,194,247 B1 * | 2/2001 | Burns et al. | ............. 438/107 |
| 6,252,791 B1 * | 6/2001 | Wallace et al. | ............. 365/52 |
| 6,444,501 B1 * | 9/2002 | Bolken | ............. 438/127 |
| 6,624,005 B1 | 9/2003 | DiCaprio et al. | |
| 6,727,575 B2 | 4/2004 | Sakabe | |
| 6,730,995 B2 | 5/2004 | Bolken | |
| 6,833,768 B2 * | 12/2004 | Harima et al. | ............. 331/158 |
| 6,838,759 B1 | 1/2005 | Liu | |
| 6,843,421 B2 | 1/2005 | Chhor et al. | |
| 6,861,683 B2 | 3/2005 | Rissing et al. | |
| 6,867,485 B2 * | 3/2005 | Wallace | ............. 257/679 |
| 2004/0169285 A1 | 9/2004 | Verma et al. | |
| 2005/0077607 A1 | 4/2005 | Hsich et al. | |
| 2006/0108674 A1 * | 5/2006 | Liou et al. | ............. 257/679 |
| 2006/0157573 A1 * | 7/2006 | Nishizawa et al. | ............. 235/492 |

* cited by examiner

*Primary Examiner*—Phat X Cao
(74) *Attorney, Agent, or Firm*—Sawyer Law Group, P.C.

(57) ABSTRACT

A memory card assembly with a simplified structure. The memory card assembly has a memory card assembly a printed wiring board substrate and at least one integrated circuit unit mounted and electrically connected to the printed wiring board substrate. A rigid ring is fitted over a periphery of the printed wiring board substrate to encircle the integrated circuit die therein. Thereby, a dam with an open top is constructed over the printed wiring board substrate. A filler resin material is then filled within the open dam to cover the printed wiring board substrate and integrated circuit unit.

20 Claims, 3 Drawing Sheets

HIGH-CAPACITY MEMORY CARD AND METHOD OF MAKING THE SAME

CROSS-REFERENCE TO RELATED APPLICATIONS

Not Applicable

STATEMENT RE: FEDERALLY SPONSORED RESEARCH/DEVELOPMENT

Not Applicable

BACKGROUND

The present invention relates in general to a memory card and a method of making the same, and more particularly, to a high-capacity memory card and a method of fabricating the same.

A majority of current digital memory cards is designed based on non-volatile semiconductor flash memory with NAND architecture. Each of the digital memory cards contains one or more flash memory semiconductor integrated circuits (IC) or packages, a controller, some necessary passive components and a printed wiring board substrate (PWB) for interconnection and socket contact. Examples of the digital memory cards include multi-medium cards (MMC), compact flash (CF) cards, secure digital (SD) cards and their modifications such as mini-SD cards and reduced size MMC cards. These cards must conform to specified form factor so that they can fit into various reading slots and readers in various electronics and communications gadgets such as notebook computers, digital cameras, personal computers (PC), and personal data assistant (PDA). For example, an MMC card is typically formed with the dimension of 32 mm×24 mm×1.4 mm.

Currently, the most commonly seen MMC card is in the form of a chip-on-board (COB) assembly, in which a flash IC chip and a controller IC are mounted to a printed wiring board substrate having circuit traces and bond pads formed thereon. The flash IC chip and the controller IC can be electrically connected to the printed circuit board and to each other by bonding wires. The finish bottom side of the substrate is normally coated with a scratch-resistant. Copper/gold plated contact pads are exposed for connecting to a reader device when such MMC card is inserted therein. To further protect the COB assembly, a two-step molding process is performed. The two-step molding process includes applying a transfer mold resin or glob-top liquid encapsulate over the IC's and wiring of the COB assembly, followed by the application of an injection mold resin to form a top portion of the assembly. The overall finish MMC card thickness normally ranges between 1.4±0.1 mm; and for SD card, the over finish thickness normally ranges between 2.1±0.1 mm. In a simplified process, the first step, that is, the application of the encapsulate layer is eliminated and the resin material is directly applied over the COB assembly. Although the simplified process reduces the manufacturing cost, the finished card typically suffers from bowing or bending over a certain period of time due to differences in stiffness and thermal expansion coefficient. FIG. 1 illustrates the comparison between a card 10 with a straight edge and a card 12 that is slightly bowed. As shown, metal contacts 11 are formed one edge of each of the cards 10 and 12. As the metal contacts 11 formed on the card 12 are located on the tapered edge bowing or doming of the card, they are easily stuck in a reader slot or jammed inside the slot and difficult to remove therefrom. Forced withdraw of the card 12 often cause the external label or surface to be scratched. In more severe cases, the card could be damaged or broken.

In another conventional MMC card assembly that includes a TSOP package of a flash IC unit and a controller unit mounted to a printed wiring circuit board substrate, an adhesive material is applied to form a thin cover over the printed wiring board substrate. The assembly includes a plurality of downward gull wing leads soldered to surface-bonding pads of the printed wiring board substrate for interconnecting the TSOP package. The controller unit is connected to the printed wiring board substrate via solder joints. To keep the overall thickness of the assembly within a specified nominal value of 1.4 mm, the top surface of the thin cover has to be minimized. When the top surface cover is made of plastic material, internal voids exist inside the assembly. The very thin top surface sometimes may not provide sufficient mechanical strength to keep the assembly strong and stiff. It is more susceptible to breakage, moisture intrusion, and bending.

It is therefore a substantial need to develop an assembly of a memory card that will retain its original configuration over time and have improved mechanical strength, while the thickness thereof can be minimized by introducing such characteristics.

BRIEF SUMMARY

A memory card assembly with a simplified structure is provided. The memory card assembly uses a rigid ring fitted over a printed wiring board substrate on which a memory integrated circuit unit is mounted, such that the filler resin applied over the printed wiring board substrate for protecting the memory integrated circuit unit is well retained by the rigid ring and will not be peeled off or deformed over time. Therefore, the requirement of top protection cover is eliminated, while the mechanical strength of the memory card assembly is retained.

As provided, the memory card assembly includes a memory card assembly a printed wiring board substrate and at least one integrated circuit unit mounted and electrically connected to the printed wiring board substrate. A rigid ring is fitted over a periphery of the printed wiring board substrate to encircle the integrated circuit die therein. Thereby, a dam with an open top is constructed over the printed wiring board substrate. A filler resin material is then filled within the open dam to cover the printed wiring board substrate and integrated circuit unit.

In one embodiment, the integrated circuit unit includes a single flash IC die or a stack of flash IC dies. The memory card assembly may further comprise a controller integrated circuit mounted and electrically connected to the printed wiring board substrate. Preferably, the overall height of the assembly is 1.4 mm. To reinforce the attachment of the filler resin material and the rigid ring, the rigid ring has an inner sidewall gradually inclined towards an outer sidewall thereof. Or alternatively, the inner sidewall of the rigid ring is recessed towards an outer sidewall thereof to form a notch pointing at the outer sidewall. Therefore, not only a portion of the filler resin material is retained within the inner sidewall of the rigid ring, but the contact area between the filler resin material and the rigid ring is increased. Alternatively, the integrated circuit unit may also include a TSOP leadframe package that comprises a flash integrated circuit therein. The height of the rigid ring is no less than the height of the integrated circuit unit.

A method of fabricating a memory card assembly is also provided, which includes the following steps. At least one memory integrated circuit unit is mounted on a printed wiring board substrate. A rigid ring is fitted over a periphery of the printed wiring board substrate to form a dam in which the memory integrated circuit unit is located. The dam is then filled with a filler resin material. Thereby, the memory integrated circuit is well protected by the filler resin material without the formation of a top cover. Preferably, the rigid ring outstands the memory integrated circuit unit such that the memory integrate circuit unit is covered by a part of the filler resin material with a thickness substantially the same as the height difference between the rigid ring and the memory integrated circuit unit.

In one embodiment, the memory integrated circuit unit in the form of a single flash IC package or a package of multiple flash IC's. Often, a controller IC is also mounted on the printed wiring board substrate. Preferably, the height of the rigid ring is no less than a height of the memory integrated circuit unit, such that the top surface of the memory integrated circuit unit can be covered by the a portion of the filler resin material. The rigid ring having a straight inner sidewall, an inclined inner sidewall, or an inner sidewall gradually inclined outwardly towards the printed wiring board substrate. Alternatively, the inner sidewall of the rigid ring is recessed to form a notch pointing outwardly.

A high-capacity memory card is also provided. The high-capacity memory card includes a rigid ring encircling a flash memory unit therein and a filler resin covering the flash memory unit within the rigid ring. The rigid ring outstands the flash memory unit by a height difference, and the filler resin on top of the flash memory unit has a thickness equal to the height difference.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
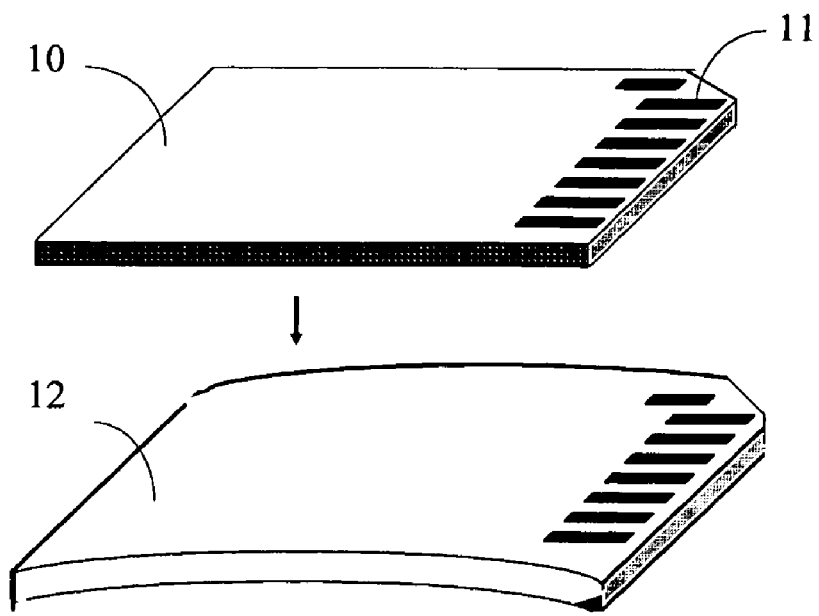
FIG. 1 illustrates the bowing effect of a conventional memory card.
Figure 2:
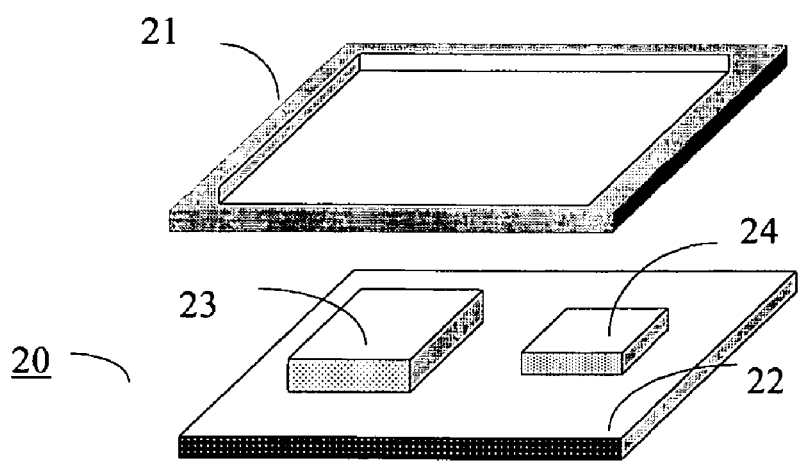
FIG. 2 shows the application of a rigid stiffener ring to a sub-assembly of an integrated circuit.

As shown in FIG. 2, a rigid ring 11 having an exterior dimension of 24 mm wide and 32 mm long is fitted over a printed wiring board substrate 22 of a sub-assembly that comprises an integrated-circuit package 23 and a controller 24 mounted on the printed wiring board substrate 22. The integrated circuit package 23 includes a flash integrated circuit package, for example. As shown, the rigid ring 21 is attached to a periphery of the printed wiring board substrate 22 by an adhesive layer to encircle the integrated circuit package 23 and the controller 24 therein. Preferably but optionally, the rigid ring 21 includes a pre-mold engineering thermoplastic within stable dimensions and toughness or a metallic ring made from stainless steel, aluminum or other alloys. Preferably, the height of the rigid ring 21 is no shorter than the thickness of both the integrated circuit package 23 and the controller 24. The height of the rigid ring 21 and the thickness of the adhesive layer are also determined based on the thickness of the printed wiring board substrate 22 to the extent that the overall thickness of the assembly will not exceed 1.4 mm.

Figure 3:
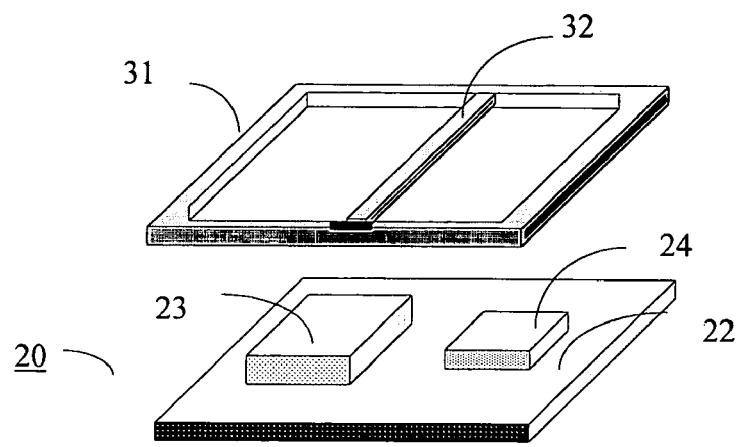
FIG. 3 shows a modification of the rigid stiffener ring as shown in FIG. 2.

FIG. 3 shows a modification of the rigid ring. In this embodiment, the rigid ring 31 to be fitted over the sub-assembly of the integrated circuit package 23 and the controller unit 21 mounted to the printed wiring board substrate 20 includes a center bar or ridge 32 extending between two opposing sides of the ring frame 31. In the embodiment as shown in FIG. 3, the center bar 32 extends between the integrated circuit package 23 and the controller unit 21 consequently divides the integrated circuit package 23 and the controller unit 21 into two individual compartments. Similar to the previous embodiment, preferably, the height of the rigid ring 31 is no shorter than the height of the integrated circuit package 23 and the controller 24, such that the integrated circuit package 23 and the controller 24 can be properly protected by the rigid ring frame 31 and a filling resin or encapsulate (which will be further introduced as follows).

Figure 4:
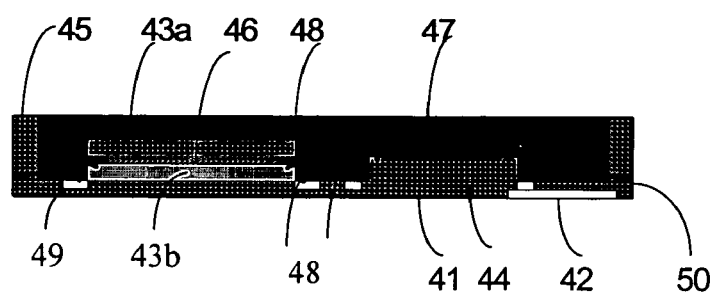
FIG. 4 shows a cross sectional view of an integrated circuit assembly which uses a rigid stiffener.

FIG. 4 illustrates a side view of an assembly of an integrated circuit package that uses the rigid ring frame to replace the conventional encapsulate or cover. As shown, the assembly includes a printed wiring board substrate 41 on which circuit traces and bonding pads 49 are formed, an integrated circuit package 43 and a controller IC 44 mounted on the printed wiring board substrate 41. In this embodiment, the integrated circuit package includes a top flash IC 43a and a lower IC 43b electrically connected to the bonding pads 49 of the printed wiring board substrate 41 via bonding wires 48. As shown, the lower IC 43b is attached one surface of the printed wiring board substrate 41, while the top flash IC 43a is stacked on the lower IC 43b. A spacer 46 is applied between the top flash IC 43a and the lower IC 43b to provide a gap therebetween. The controller IC 44 is also connected to the bonding pads 49 of the printed wiring board substrate 41 via the bonding wire 48.

As shown in FIG. 4, the rigid ring frame 45 is fitted over the printed wiring board substrate 41 to fencing the integrated circuit package (43a and 43b) and the controller IC 44 therein. Preferably but optionally, the rigid ring frame 45 is attached to the periphery of the printed wiring board substrate 41 by applying an adhesive tape or paste between the rigid ring frame 45 and the printed wiring board substrate 41. When the rigid ring frame 45 is attached along the periphery of the printed wiring board substrate 41, a filler resin material 47 is dispensed over the printed wiring board substrate 41 by a dispensing machine. The filler resin material 47 is preferably in the form of a liquid encapsulate flowing within the dam constructed by the rigid ring frame 45. Alternatively, the filler resin material 47 can also be selected from other types of thermoplastic materials or elastomeric resins applied by injection molding process. Preferably, the height of the rigid ring frame 66 is no less than the height of the integrated circuit package and the controller IC 44, such that the integrated circuit package and the controller IC 44 can be well covered and protected by the filler resin material 47.

Figure 5:
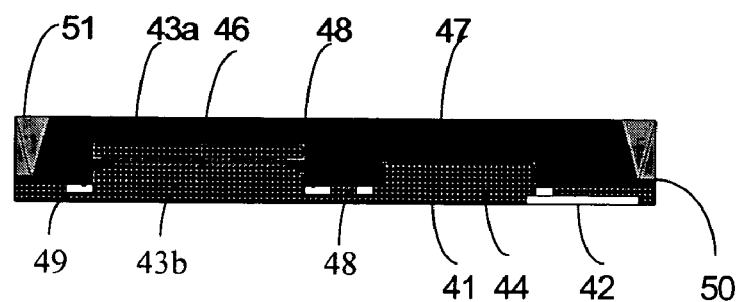
FIG. 5 shows a cross sectional view of an integrated circuit assembly having alternative shape of the rigid stiffener ring interior.

In the embodiments as discussed above, the rigid ring frames 21, 31, and 45 as shown in FIGS. 2, 3 and 4 all comprise straight sidewalls. It will be appreciated that the shape of the sidewalls of the rigid ring frames can be altered to achieve specific requirement without exceeding the scope and spirit of the present invention. For example, as shown in FIG. 5, the rigid ring frame 51 has an inner sidewall of which the thickness is gradually reduced towards the printed wiring board substrate 41. The inclined inner sidewall of the rigid ring frame provides an improved holding of the filler resin material 47, such that the attachment of the rigid ring frame 51 over the printed wiring board substrate 41 is reinforced. The rigid ring frame 51 may include an integrally formed structure or a plurality of rings integrated together. For example, in this embodiment, the rigid ring frame 51 includes two rings, an inner ring having an inverse triangular cross section and an outer ring having a triangular cross section, attached to each other. As a top cover is not required, in addition to two-die (integrated circuit) package as disclosed above, the integrated circuit package may be a stack of more than two dies.

Figure 6:
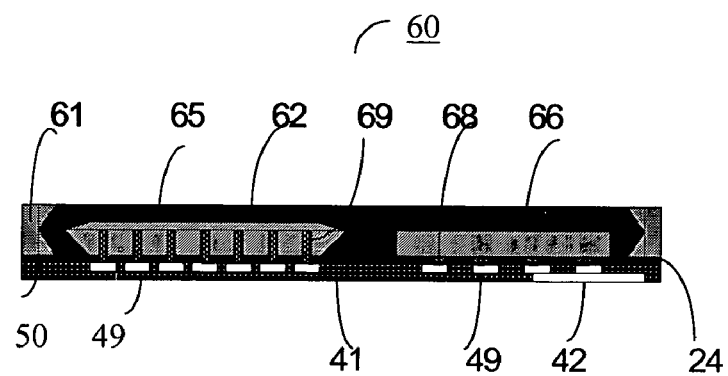
FIG. 6 shows the application of the rigid stiffener ring to another sub-assembly of an integrated circuit.

FIG. 6 shows another exemplary assembly 60 of an integrated circuit. In FIG. 6, the flash IC is enclosed by a TSOP leadframe package 65. The leadframe package 65 includes a plurality of leads 69 soldered to the bonding pads 49 of the printed wiring board substrate 41. The controller IC 66 mounted to the printed wiring board substrate 41 is electrically connected to the bonding pads 49 by solder joints 68. In this embodiment, when the combined height of the TSOP package leadframe package 65 and the printed wiring board substrate 41 is about 1.35 mm, the filler resin material 62 filled within the rigid ring frame 61 allows a maximum thickness of about 0.05 mm on top of the TSOP leadframe package 65. Within the TSOP leadframe package 65, a single flash IC or a stack of dies may be used to increase memory capacity. As shown in FIG. 6, the center of the inner sidewall of the rigid ring frame 61 is recessed to form a notch pointing outwardly towards the outer sidewall thereof. The formation of the notch provides more contact area for interlocking with the filler resin material 62. The inclined and recessed inner sidewalls do not only provide a structure in which a part of the filler resin material can be retained, but also increase the contact area for interlocking the filler resin material.

As the printed wiring board substrates as disclosed above are in rectangular shape with a dimension of 24 mm×32 mm×1.4 mm, the rigid ring frame is preferably a rectangular shape with an exterior dimension of 24 mm×32 mm×1.4 mm. When the printed wiring board substrates are formed with shapes other than rectangle, the shapes of the rigid ring frame will be changed according to the specific shapes of the printed wiring board wiring substrates. Further, as the dimension of memory card assembly depends on the receiving slot of the reader, the height of the rigid ring frame and thickness of the filler resin material will change accordingly.

The above description is given by way of example, and not limitation. Given the above disclosure, one skilled in the art could devise variations that are within the scope and spirit of the invention disclosed herein. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A memory card assembly, comprising:
    a printed wiring board substrate having upper and lower surfaces, the printed wiring board having a contact pad engageable with a reader device, the contact pad disposed on the lower surface, the printed wiring board defining an outer substrate periphery;
    at least one integrated circuit unit mounted and electrically connected to the printed wiring board substrate;
    a filler resin material applied over the printed wiring board substrate and the integrated circuit unit; and
    a rigid retaining member defining an inner retaining periphery being less than the outer substrate periphery, the rigid retaining member having an inner sidewall fitted over the printed wiring board substrate, the retaining member being operative to retain the filler resin material as it is applied over the printed wiring board substrate and the integrated circuit unit, the rigid retaining member defining an outer periphery that is engageable to the substrate upon vertical translation, the inner sidewall defining a variable sidewall thickness along an intermediate portion of the inner sidewall and forming a notch in the vertical direction at approximately the center of the inner sidewall, the notch pointing outwards into the rigid retaining member.

2. The assembly of claim 1, wherein the integrated circuit unit includes a single flash IC die.

3. The assembly of claim 1, wherein the integrated circuit unit includes a stack of flash IC dies.

4. The assembly of claim 1, further comprising a controller integrated circuit mounted and electrically connected to the printed wiring board substrate.

5. The assembly of claim 1, wherein the memory card assembly includes a secure-digital card, a mini-secure-digital card, a micro-secure digital card, a multimedia circuit card, or a mini-multimedia circuit card.

6. The assembly of claim 1, wherein the inner sidewall of the retaining member is gradually inclined towards an outer sidewall thereof.

7. The assembly of claim 1, wherein the integrated circuit unit includes a TSOP leadframe package that comprises a flash integrated circuit therein.

8. The assembly of claim 1, wherein the retaining member has a height no less than the height of the integrated circuit unit.

9. The assembly of claim 1, wherein the rigid ring retaining member includes a center bar extending between two opposing sides thereof.

10. A method of fabricating a memory card assembly, comprising:
    a) mounting at least one memory integrated circuit unit on a printed wiring board substrate having upper and lower surfaces, the printed wiring board having a contact pad engageable with a reader device, the contact pad disposed on the lower surface, the printed wiring board defining an outer substrate periphery;
    b) fitting a rigid retaining member over the printed wiring board substrate to form a dam in which the memory integrated circuit unit is located the rigid retaining member defining an inner retaining periphery being less than the outer substrate periphery, the rigid retaining member defining an outer periphery that is engageable to the substrate upon vertical translation, the rigid retaining member having an inner sidewall defining a variable sidewall thickness along an intermediate portion of the inner sidewall, and forming a notch at approximately the center in the vertical direction of the inner sidewall, the notch pointing outwards into the rigid retaining member; and
    c) filling the retaining member with a filler resin material.

11. The method of claim 10, wherein step (a) includes providing the memory integrated circuit unit in the form of a single flash IC package.

12. The method of claim 10, wherein step (a) includes providing the memory integrated circuit unit in the form of a package of multiple flash IC's.

13. The method of claim 10, wherein step (a) further comprising mounting a controller IC on the printed wiring board substrate.

14. The method of claim 10, wherein step (b) comprises providing the retaining member with a height no less than a height of the memory integrated circuit unit.

15. The method of claim 10, wherein the inner sidewall is gradually inclined outwardly towards the printed wiring board substrate.

16. The method of claim 10, wherein step (b) further comprises providing the retaining member having a recessed inner sidewall.

17. A high-capacity memory card, comprising:
a flash memory unit disposed on a printed wiring board substrate;
a filler resin covering the flash memory units; and
a rigid retaining member having an inner sidewall encircling the flash memory unit, the rigid retaining member defining an outer periphery that is engageable to the substrate upon vertical translation, the inner sidewall defining a variable sidewall thickness along an intermediate portion of the inner sidewall, and forming a notch in the vertical direction at approximately the center of the inner sidewall, the notch pointing outwards into the rigid retaining member, the retaining member being operative to retain the filler resin as it is disposed over the flash memory unit, wherein the retaining member outstands the flash memory unit by a height difference, and the filler resin on top of the flash memory unit has a thickness equal to the height difference.

18. The memory card of claim 17, wherein the retaining member includes a bar extending between two opposing points of the retaining member.

19. A memory card assembly, comprising:
a printed wiring board substrate;
at least one integrated circuit unit mounted and electrically connected to the printed wiring board substrate;
a filler resin material applied over the printed wiring board substrate and the integrated circuit unit; and
a rigid retaining member having an inclined inner sidewall fitted over a periphery of the printed wiring board substrate, the inner sidewall of the retaining member being gradually inclined towards an outer sidewall thereof, and forming a notch in the vertical direction at approximately the center of the inner sidewall, the notch pointing outwards into the rigid retaining member, the rigid retaining member including a center bar extending between two opposing sides thereof, the rigid retaining member being operative to retain the filler resin material as it is applied over the printed wiring board substrate and the integrated circuit unit.

20. A memory card assembly, comprising:
a printed wiring board substrate having upper and lower surfaces, the printed wiring board having a contact pad engageable with a reader device, the contact pad disposed on the lower surface, the printed wiring board defining an outer substrate periphery;
at least one integrated circuit unit mounted and electrically connected to the printed wiring board substrate;
a filler resin material applied over the printed wiring board substrate and the integrated circuit unit; and
a rigid retaining member defining an inner retaining periphery being less than the outer substrate periphery, the rigid retaining member having an inner sidewall fitted over the printed wiring board substrate, the retaining member being operative to retain the filler resin material as it is applied over the printed wiring board substrate and the integrated circuit unit, the rigid retaining member defining an outer periphery that is engageable to the substrate upon vertical translation, the inner sidewall defining a variable sidewall thickness along an intermediate portion of the inner sidewall and forming a notch at approximately the center of the inner sidewall, the notch pointing outwards into the rigid retaining member, wherein at least a portion of the inner sidewall is gradually inclined outwardly towards the printed wiring board substrate.

* * * * *